United States Patent [19]

Meuleman

[11] 4,347,610
[45] Aug. 31, 1982

[54] CONTROL CIRCUIT FOR THE DRIVE CURRENT OF A LASER

[75] Inventor: Lambertus J. Meuleman, Eindhoven, Netherlands

[73] Assignee: U.S. Philips Corporation, New York, N.Y.

[21] Appl. No.: 189,289

[22] Filed: Sep. 22, 1980

[30] Foreign Application Priority Data

Oct. 18, 1979 [NL] Netherlands .......................... 7907683

[51] Int. Cl.³ .............................................. H01S 3/13
[52] U.S. Cl. ................................................. 372/29
[58] Field of Search ........................ 372/29, 30, 31, 33, 372/38

[56] References Cited

U.S. PATENT DOCUMENTS 3,898,583  8/1975  Shuey ..................................... 372/29
4,166,985  9/1979  White et al. ........................... 372/30
4,237,427 12/1980  Holland ................................. 372/29

FOREIGN PATENT DOCUMENTS 2025121  1/1980  United Kingdom .................. 372/29

*Primary Examiner*—James W. Davie
*Attorney, Agent, or Firm*—Thomas A. Briody; Robert T. Mayer; Algy Tamoshunas

[57] ABSTRACT

Control circuit for controlling a laser drive current. In known control circuits certain levels of the optical output signal are kept constant. This renders it difficult to satisfy certain requirements during the life of the laser as regards the linearity of the modulation of the optical output signal. In the described control circuit the intermodulation of two signals present in the modulation signal with substantially constant amplitudes is measured, an error signal which controls a component of the drive current being derived therefrom.

4 Claims, 7 Drawing Figures

CONTROL CIRCUIT FOR THE DRIVE CURRENT OF A LASER

The invention relates to a control circuit for controlling a component of an injection laser drive current which current is formed by the modulation current component and the bias current component.

It is known, for example from IEEE Transactions on Communications, Volume Com-26, No. 7, July 1978, pages 1088–98, to control the modulation current component so that the difference between the maximum and the minimum optical output power is stabilised and to control the bias current component so that the minimum optical output power is stabilised.

From Netherlands Patent Application 7803125, which has been laid open to public inspection, it is known to stabilise the maximum or the mean optical output power by controlling of the modulation current component. Stabilising the mean optical output power by controlling of the bias current component is known from, for example, the 4th European Conference on Optical Fiber Communication, Genua, Sept. 12–15, 1978, pages 438–48.

On modulation of the optical output signal of the laser by an analogue modulation signal, for example a television video signal, the laser must be adjusted in the linear range of the laser characteristic and be maintained in that range by controlling the drive current.

The prior art control circuits for the drive current have the drawback that the non-linear distortion in the modulated optical output signal increases with age of the laser.

It is an object of the invention to provide a control circuit which is suitable for use with linear modulation of the optical output signal of the laser.

According to the invention, a control circuit for controlling a component of an injection laser drive current which current is formed by the modulation current component and the bias current component is characterized in that said circuit comprises detection means for detecting in a signal derived from the optical output signal of the laser the inter-modulation product signal of at least two signals which are present in the modulation current component with substantially constant amplitudes in order to generate a control signal, and means for comparing the control signal with a reference signal for forming an error signal, and control means for controlling the intensity of the said component of the laser drive current in response to the error signal.

The invention and its advantages will be further explained with reference to the accompanying drawing.

Figure 1:
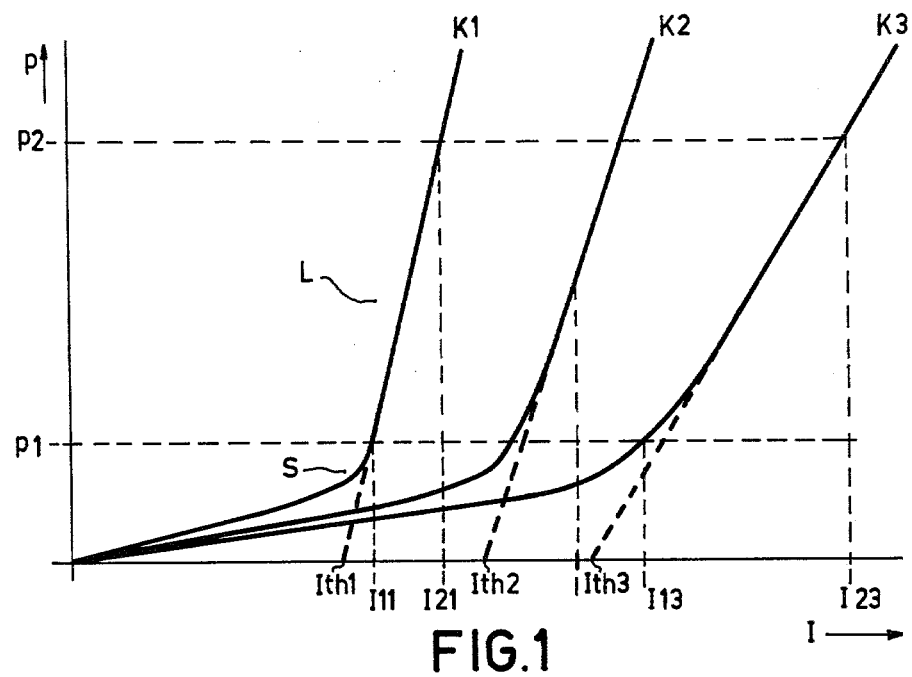
FIG. 1 shows a number of laser characteristics.

The laser characteristic which indicates the relationship between the optical output power P and the current I through the laser depends on the ambient temperature and on the age of the laser. FIG. 1 illustrates three characteristics K1, K2 and K3 of a laser, the temperature and/or the age of the laser increases from K1 to K2 to K3. The operating range must be adjusted so, that the electrooptical transmission satisfies certain requirements with respect to the optical power. This means, for example, that with characteristic K1 the current is set in the range between I11 and I21 and that with characteristic K3 the current is set in the range between I13 and I23 for an optical power in the range between P1 and P2. An adaptation of the operating range when the characteristic changes is therefore necessary.

The main changes are in the value of the threshold current Ith, in the slope of the characteristic in the linear range (L), and in the curve in the transition range (S), which forms the transition between the range of the spontaneous emission and the linear range.

When the laser is modulated by an analogue modulation signal, non-linear distortion occurs in the range where the laser characteristic is non-linear. A change in the characteristic, which causes the bend at the threshold current Ith to become less pronounced produces an increase in the non-linear distortion.

Figure 2:
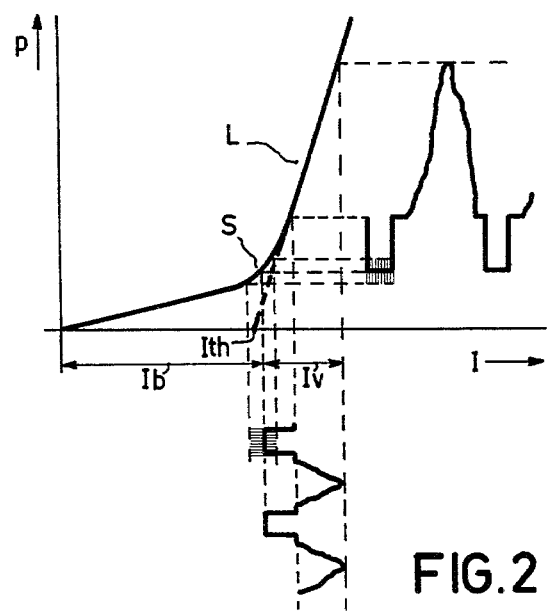
FIG. 2 illustrates the modulation of the optical output signal.

FIG. 2 illustrates the modulation of the laser by a television video signal including a line synchronizing signal and a sound carrier. As shown, the video signal Iv is added to a bias current Ib. The adjustment of the bias current is such that when the threshold current Ith increases in response to the temperature or because the laser ages, the peaks of the line synchronizing pulses move the laser operating range into the curved portion S of the characteristic. This causes non-linear distortion of the video signal.

Which such modulation, the mean optical output power can be stabilised in known manner by controlling the bias current Ib. The bias current is then adapted to the increase of the threshold current Ith. However, the transition range S increases in extent when the threshold current increases, causing the non-linear distortion to increase.

In order to be able to permanently satisfy certain requirements with respect to the linearity of the modulation of the optical output power, the intermodulation product signal of two signals present in the modulation signal having substantially constant amplitudes is detected and a control signal is derived therefrom with which the adjustment of the laser is adapted such that the non-linear distortion remains within the permissible values.

Figure 3:
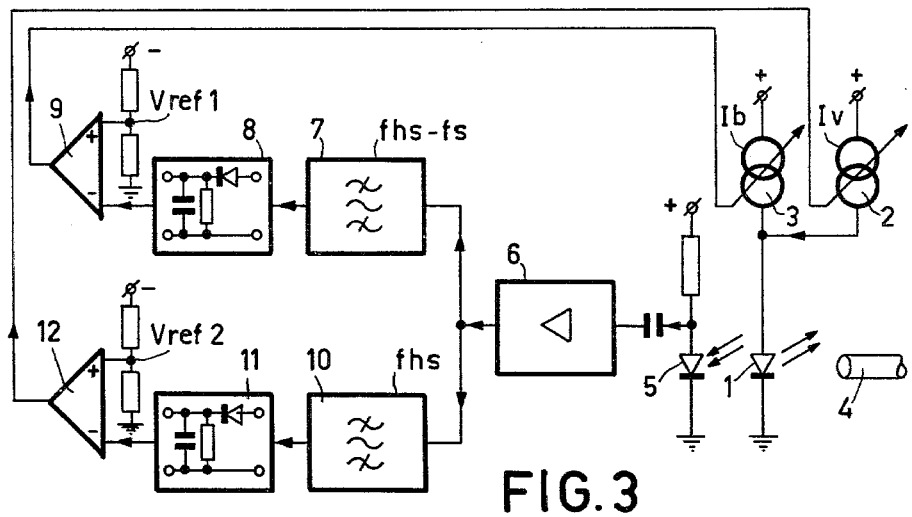
FIG. 3 is a block schematic diagram of a first control circuit embodying to the invention.
Figure 4:
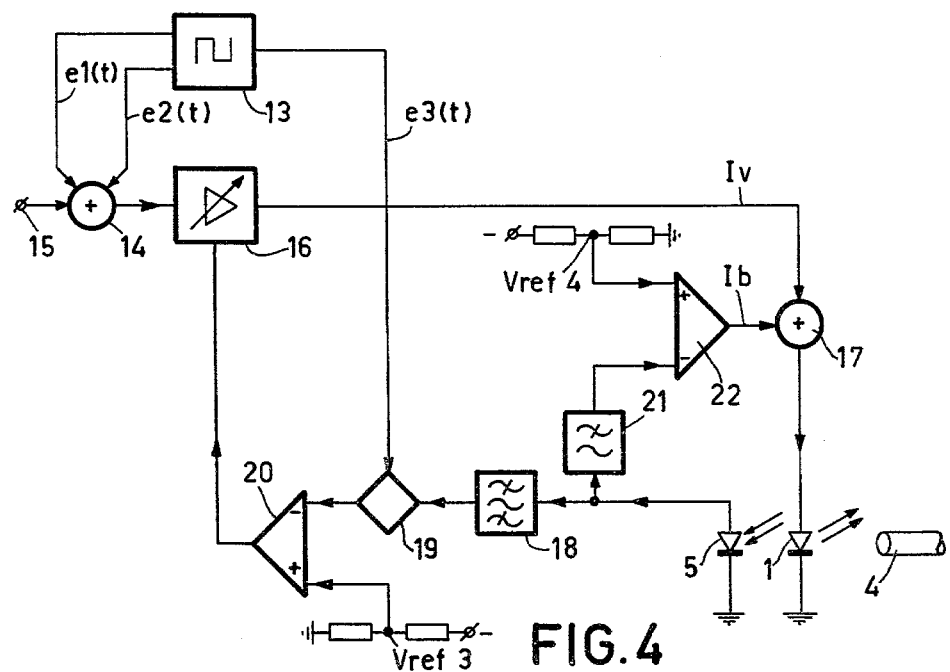
FIG. 4 is the block schematic diagram of a second control circuit embodying to the invention.

Adapting the adjustment of the laser can be effected by controlling the bias current (FIG. 3) or by controlling the modulation current (FIG. 4). In either case the control of the other current component can be done in known manner.

In the control circuit shown in FIG. 3 an injection laser 1 is modulated by an analogue video signal Iv including the line synchronizing signal and the sound carrier (FIG. 2), produced by a controlled current source 2. The bias current Ib is produced by a controlled current source 3. An optical fibre 4 and a photosensitive detector 5 are coupled to the laser.

In the case of the transmission of a television signal, the intermodulation product signal of the line synchronizing signal (frequency fs ≈ 15.7 kHz) and the sound carrier (frequency fhs = 4.5 mHz) can be detected in the optical output signal. In view of the non-linearity in the transition range S, the sound carrier is modulated by the line synchronizing signal, which produces signals at the sideband frequencies (fhs−fs) and (fhs+fs).

The AC-component of the output signal of the photosensitive detector 5 is amplified by a high-frequency amplifier 6 and subsequently to a band filter 7, which has been tuned to the frequency fhs−fs. The output signal thereof is rectified by rectifier 8.

The output signal of rectifier 8 is applied to the inverting input of the operational amplifier 9. A reference voltage Vref1, which is a measure of the permissible non-linear distortion of the laser output is applied to the non-inverting input of the operational amplifier. An error signal is produced at the output of the amplifier 9 from the difference between the output signal of rectifier 8 and the reference voltage Vref1. This error signal is used to control the controlled current source 3 so that the bias current Ib is adapted to maintain the non-linear distortion within the permissible limits.

Changes in the slope of the laser characteristic can be compensated for by adaptation of the modulation current Iv. As a criterion for this use can be made of the amplitude of the sound carrier in the optical output signal of the laser. To this end the output signal of the high frequency amplifier 6 is also applied to a band-pass filter 10, which has been tuned to the frequency fhs. The output signal thereof is rectified by a rectifier 11.

The output signal of rectifier 11 is applied to the inverting input of an operational amplifier 12. A reference voltage Vref 2, which is a measure of the desired value of the amplitude of the sound carrier in the optical output signal, is applied to the non-inverting input of this operational amplifier. An error signal is produced at the output of the amplifier 12 from the difference between the output signal of rectifier 11 and the reference voltage Vref 2. This error signal is used to control the controlled current source 2 so that the amplitude of the sound carrier in the optical output signal has the desired value.

The intermodulation of the line synchronizing signal with the sound carrier occurs only during the synchronizing pulses and does not affect the picture quality. When, in addition to the base band video signal a plurality of television signals, which have been frequency-modulated on different sound carriers are transmitted then it may be desirable for the line synchronizing signals thereof and the line synchronizing signal of the base band video signal to be isochronous, in order to prevent the picture quality of the other television signals from being influenced by the intermodulation product signal.

In the case where the modulation signal of the laser consists of a plurality of frequency-stacked carriers whose frequency or amplitude have been modulated by television signals, adequate linearity of the modulation is then important. In this case it is possible to add low-frequency auxiliary signals to the modulation signal and to measure the intermodulation thereof.

FIG. 4 shows a control circuit which utilizes low-frequency auxiliary signals, the modulation current of laser 1 then being controlled in dependence on the occurring non-linear distortion.

Two binary signals e1(t) and e2(t) (FIG. 5), having respective fundamental frequencies of, for example, 1 and 2 kHz, are the auxiliary signals. These signals are generated by a signal generator 13 and are added in a signal adder device 14 to an information signal which is applied to signal input 15.

The information signal and the auxiliary signals pass through a controlled amplifier 16, having a current source output which produces a modulation current Iv. In a signal adder circuit 17 a bias current Ib is added to the modulation current Iv and the sum of the currents is applied to the laser 1.

Figure 5:
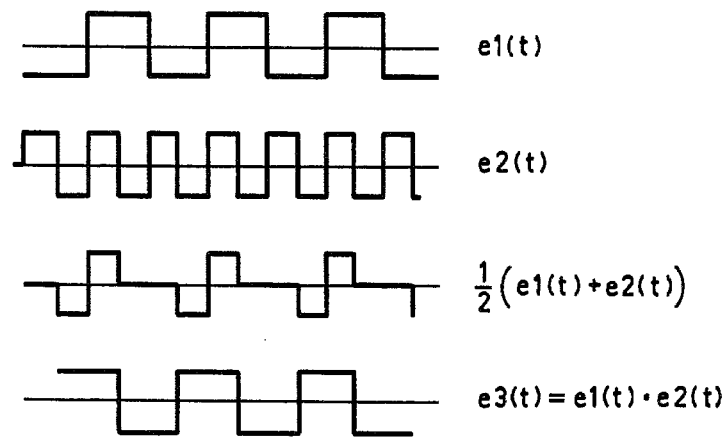
FIG. 5 illustrates some waveforms which occur in the control circuit shown in FIG. 4.
Figure 6:
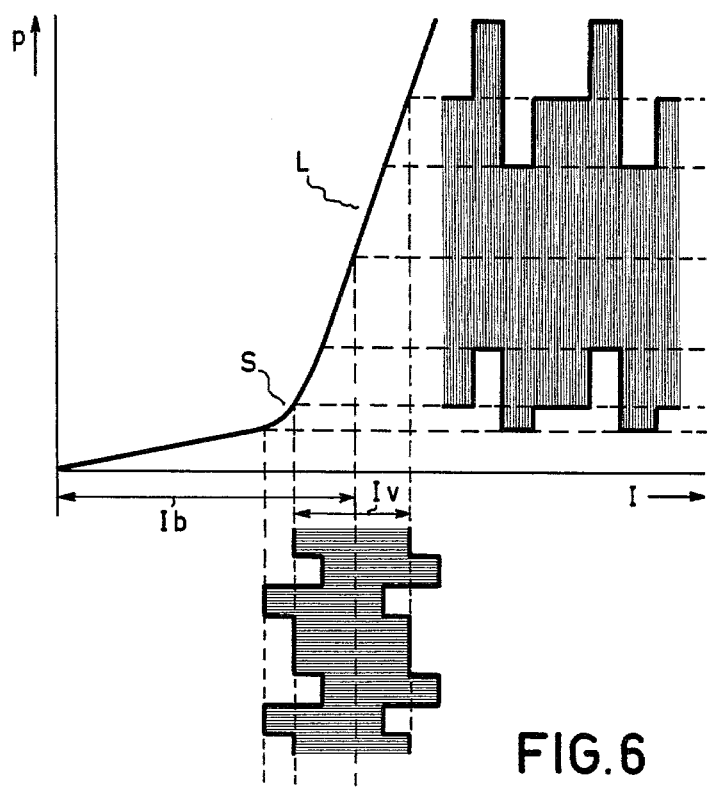
FIG. 6 illustrates the modulation of the optical output signal when the control circuit shown in FIG. 4 is used.

A half amplitude sum of the signals e1(t) and e2(t) is illustrated in FIG. 5. FIG. 6 shows how the optical output signal of the laser is modulated by the modulation current Iv, which consists of the sum of the information signal and the signals e1(t) and e2(t). The Figure shows that in the curved portion S of the laser characteristic an asymmetrical distortion of the envelope of the optical output signal occurs, compared with the portion of the envelope located in the linear range L.

In portion S of the laser characteristic there is intermodulation of the auxiliary signals e1(t) and e2(t). A considerable portion of the intermodulation signal consists of a component which is proportional to the product e3(t)=e1(t)·e2(t) (FIG. 5). This intermodulation component can be used to control the gain of amplifier 16 so that the non-linear distortion in the modulated output signal remains within the permissible limits.

The output signal of the photo-sensitive detector 5 is applied to a band-pass filter 18, which has been tuned to 1 Khz. The output signal of filter 18 is multiplied by the signal e3(t) in a product modulator 19. As a result thereof a DC-component whose value is proportional to the value of the component e1(t)·e2(t) in the optical output signal of the laser occurs at the output of modulator 19.

The output signal of modulator 19 is applied to the inverting input of an operational amplifier 20. A reference voltage Vref 3, which is a measure of the permissible non-linear distortion of the laser output is applied to the non-inverting input of this operational amplifier. The operational amplifier 20 forms an error signal from the difference between the output signal of modulator 19 and the reference voltage Vref 3. With this error signal the gain of amplifier 16 is controlled so that the non-linear distortion in the optical output signal remains within given values.

In order to facilitate detection of the intermodulation component e1(t)·e2(t) in the output signal of the photo-sensitive detector 5, it may be advisable to cancel first the components e1(t) and e2(t) in the detector output signal by means of the signals e1(t) and e2(t), from the signal generator 13.

Figure 7:
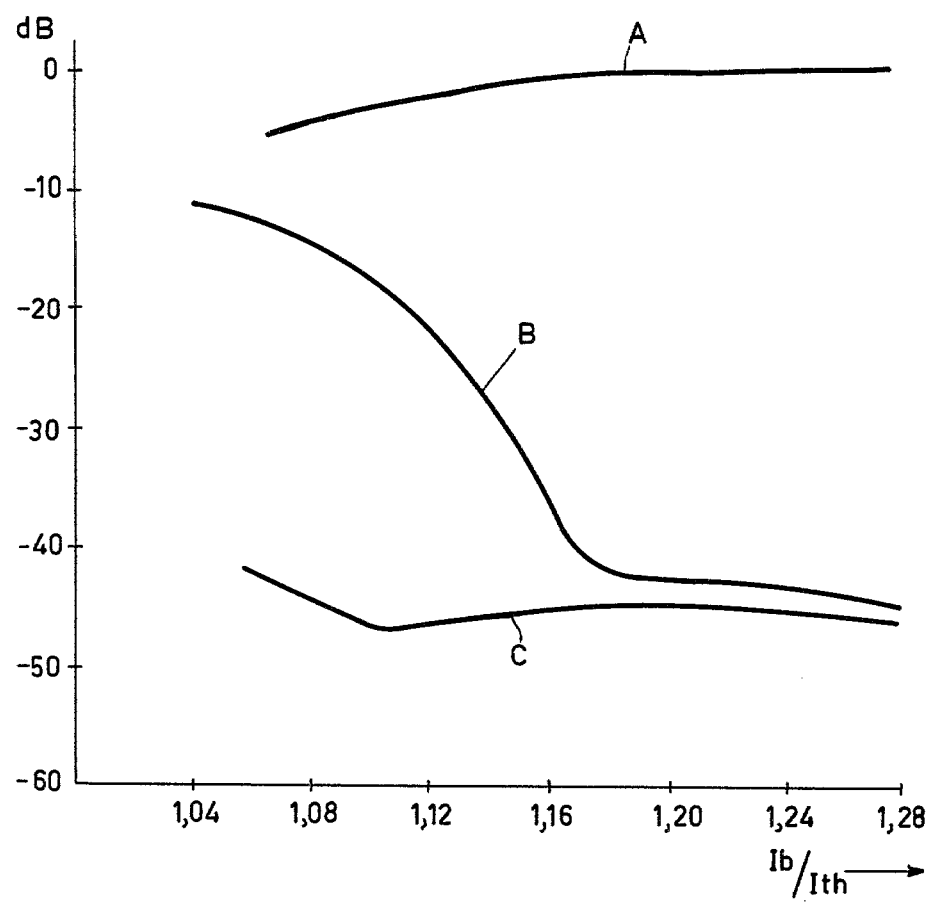
FIG. 7 illustrates the non-linear distortion as a function of the bias current with and without a control of the modulation current component.

The effect of the modulation current control in dependence on the non-distortion according to FIG. 4 is illustrated in FIG. 7 as a function of the ratio between the bias current Ib and the threshold current Ith. The Figure shows that when the bias current is decreased with respect to the threshold current, the second harmonic distortion (curve C), is kept low by the control circuit albeit at the expense of some signal intensity (curve A). Without a control circuit the distortion would have considerably increased (curve B).

The bias current Ib of laser 1 may be controlled in known manner so that the mean optical output power remains constant. The bias current Ib then follows the increase of the threshold current Ith with increasing temperature and/or age of the laser. To this end, the output signal of the photo-sensitive detector 5 in the circuit of FIG. 4 is applied by means of a low-pass filter 21 to the inverting input of an operational amplifier 22 having a current source output. A reference voltage Vref 4, which is a measure of the desired mean optical power is applied to the non-inverting input of this operational amplifier. From the difference signal, amplifier 22 derives the bias current Ib which is added to the modulation current Iv in signal adder circuit 17.

Signals other than the signals e1(t) and e2(t), illustrated in FIG. 5, may be used as auxiliary signals in a control circuit based on the measurement of the auxiliary signal intermodulation. Sinusoidinal auxiliary signals may, in principle, be used. In integrated circuits, however, it is easier to generate binary signals then to generate sinusoidinal signals.

Desirable properties of the auxiliary signals e1(t) and e2(t) are that:

$$\int (e1(t)+e2(t)) \cdot e1(t) \cdot e2(t) dt = 0 \quad (1)$$

$$\int e1(t) \cdot e2(t) dt = 0 \quad (2)$$

$$\int (e1(t) \cdot e2(t)) \cdot e1(t) \cdot e2(t) dt \neq 0 \quad (3)$$

wherein the integrals extend over an integer number of periods of the one and the other auxiliary signal. Property (1) simplifies the detection of the intermodulation component $e1(t) \cdot e2(t)$. Property (2) prevents the product modulator 19 from producing a DC-component caused by carrier leakage. Property (3) enables detection of the intermodulation signal by correlation in a product modulator (19).

What is claimed is:

1. A control circuit for controlling a component of an injection laser drive current which current is formed by a modulation current component and a bias current component, characterized in that said circuit comprises detection means for detecting in a signal derived from the optical output signal of the laser the intermodulation product signal of at least two signals which are present in the modulation current component with substantially constant amplitudes in order to generate a control signal, and means for comparing the control signal with a reference signal for forming an error signal, and control means for controlling the intensity of the said component of the laser drive current in response to the error signal.

2. A control circuit as claimed in claim 1, wherein in operation the modulation current component comprises a television video signal having a line synchronizing signal and a sound carrier, characterized in that the detection means is adapted for detecting the intermodulation product signal of the line synchronizing signal and the sound carrier.

3. A control circuit as claimed in claim 1, characterized in that means are provided for inserting two binary auxiliary signals into the modulation current component.

4. A control circuit as claimed in claim 3, characterized in that the detection means comprise means for multiplying the signal derived from the optical output signal by the product of the binary auxiliary signals.

* * * * *